(12) United States Patent
Heller

(10) Patent No.: US 10,509,445 B2
(45) Date of Patent: *Dec. 17, 2019

(54) PROTECTIVE ENCLOSURE FOR DATA STORAGE

(71) Applicant: Patrick Scott Heller, Goshen, IN (US)

(72) Inventor: Patrick Scott Heller, Goshen, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/166,684

(22) Filed: Oct. 22, 2018

(65) Prior Publication Data

US 2019/0272007 A1 Sep. 5, 2019

Related U.S. Application Data

(63) Continuation of application No. 15/909,533, filed on Mar. 1, 2018, now Pat. No. 10,185,372.

(51) Int. Cl.
| | |
|---|---|
| *H05K 7/14* | (2006.01) |
| *G06F 1/18* | (2006.01) |
| *G06F 1/20* | (2006.01) |
| *H05K 5/04* | (2006.01) |
| *G11B 33/14* | (2006.01) |
| *G11B 33/08* | (2006.01) |

(52) U.S. Cl.
CPC .............. *G06F 1/182* (2013.01); *G06F 1/187* (2013.01); *G06F 1/20* (2013.01); *G06F 1/206* (2013.01); *G11B 33/08* (2013.01); *G11B 33/14* (2013.01); *H05K 5/04* (2013.01); *H05K 7/1495* (2013.01)

(58) Field of Classification Search
CPC . G06F 1/181; G06F 1/182; G06F 1/20; G06F 1/206; H05K 7/1495; G11B 33/142; G11B 33/1426
See application file for complete search history.

(56) References Cited

U.S. PATENT DOCUMENTS

| | | | |
|---|---|---|---|
| 8,755,192 B1* | 6/2014 | Schrempp | G06F 1/20 361/679.5 |
| 10,185,372 B1* | 1/2019 | Heller | G11B 33/00 |
| 2004/0064631 A1* | 4/2004 | Kishon | G11B 33/022 711/100 |
| 2005/0057849 A1* | 3/2005 | Twogood | G11B 33/022 360/97.12 |
| 2005/0286225 A1* | 12/2005 | Moore | G06F 1/182 361/695 |
| 2007/0017685 A1* | 1/2007 | Moore | G11B 33/142 174/17 VA |

(Continued)

*Primary Examiner* — Adrian S Wilson
(74) *Attorney, Agent, or Firm* — Botkin & Hall, LLP

(57) ABSTRACT

A data storage enclosure for storing data on digital storage media has a lid that secures to a base. The enclosure has an upper insulating block that is located adjacent the lid and a lower insulating block that is located in the base. Each insulating block has a corresponding cover that overlays and protects its respective block. A storage unit has outer thermal management layers and a center layer located therebetween. The thermal management layers each contain a corresponding heat absorber that absorbs energy and changes from solid to liquid as the temperature of the storage unit begins to rise to excessive temperatures. The center layer contains a digital storage drive that is connected to a flexible cable that is connected to a sacrificial connector. When assembled, the insulating blocks and covers constrain and hold the storage unit and flexible cable.

20 Claims, 8 Drawing Sheets

(56) References Cited

U.S. PATENT DOCUMENTS

| | | | | |
|---|---|---|---|---|
| 2008/0175983 A1* | 7/2008 | Moore | ............... | C09D 163/00 |
| | | | | 427/96.6 |
| 2008/0310096 A1* | 12/2008 | Sandesara | ............ | G11B 33/025 |
| | | | | 361/679.34 |
| 2009/0021897 A1* | 1/2009 | Katzenberger | ...... | H01M 2/1022 |
| | | | | 361/679.31 |
| 2011/0017747 A1* | 1/2011 | Wildman | ............... | B29C 70/70 |
| | | | | 220/560.01 |
| 2011/0083824 A1* | 4/2011 | Rogers | .............. | H05K 7/20745 |
| | | | | 165/80.2 |
| 2012/0087085 A1* | 4/2012 | Moore | ................... | G06F 1/182 |
| | | | | 361/679.46 |
| 2016/0330861 A1* | 11/2016 | Moore | ............... | G11B 33/142 |

* cited by examiner

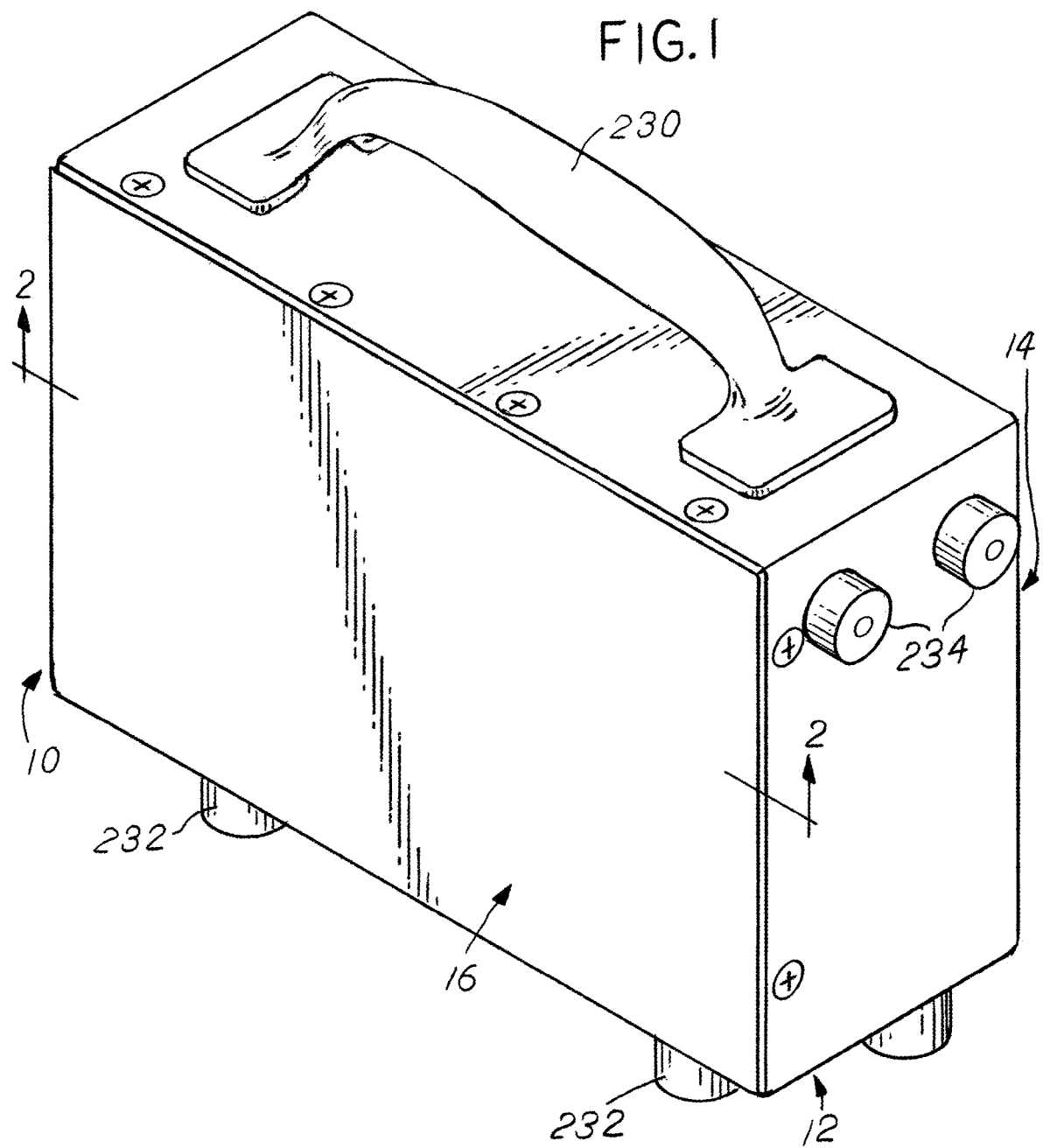

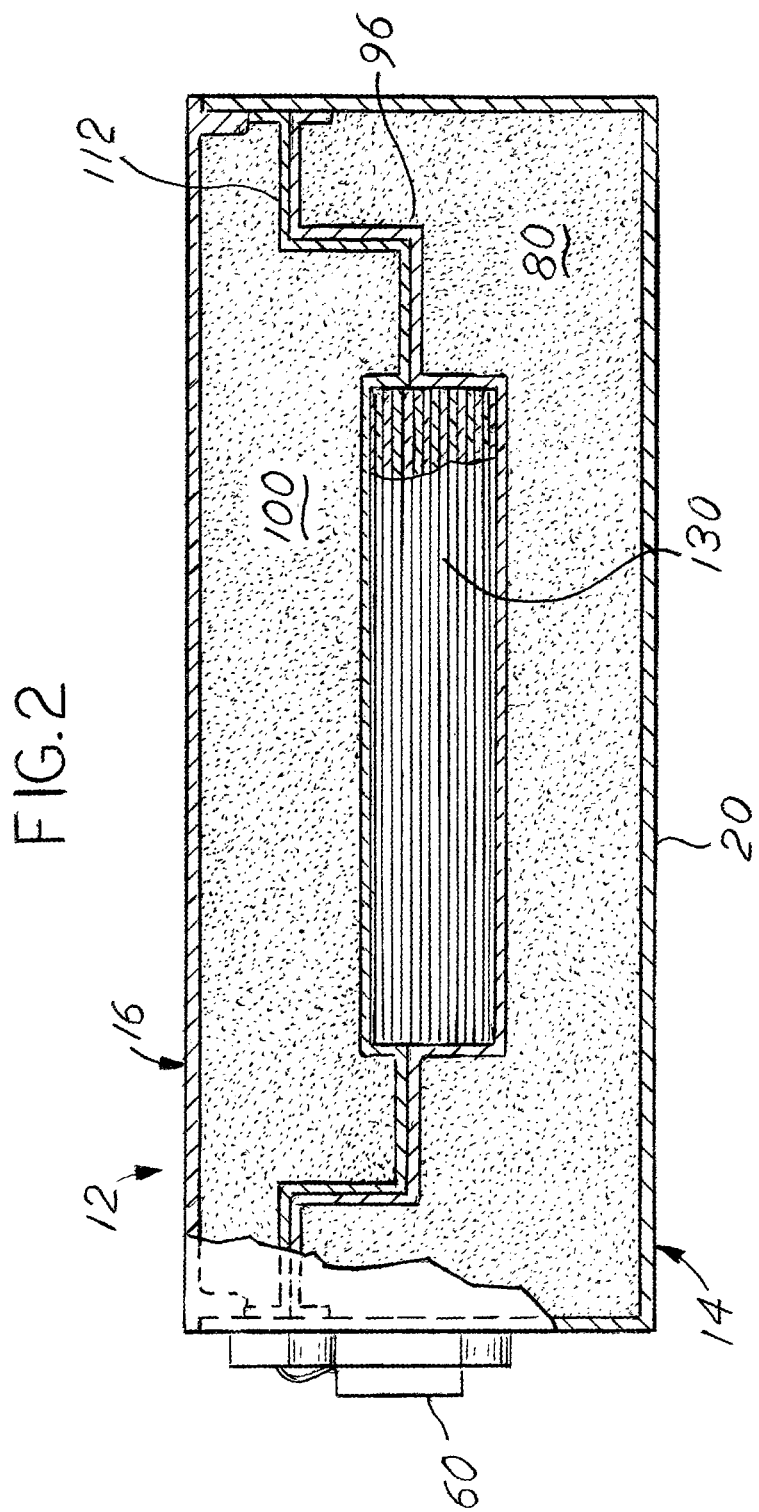

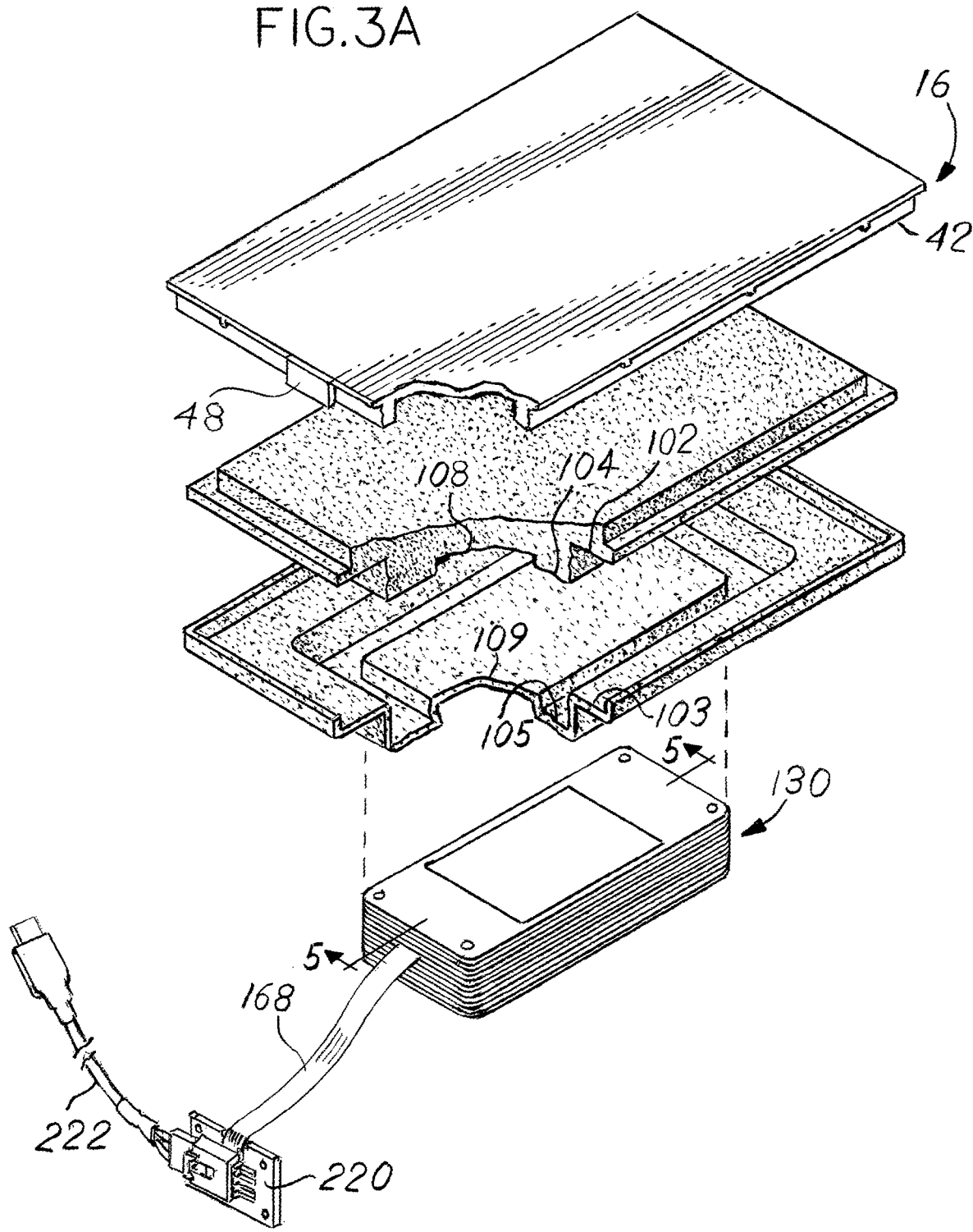

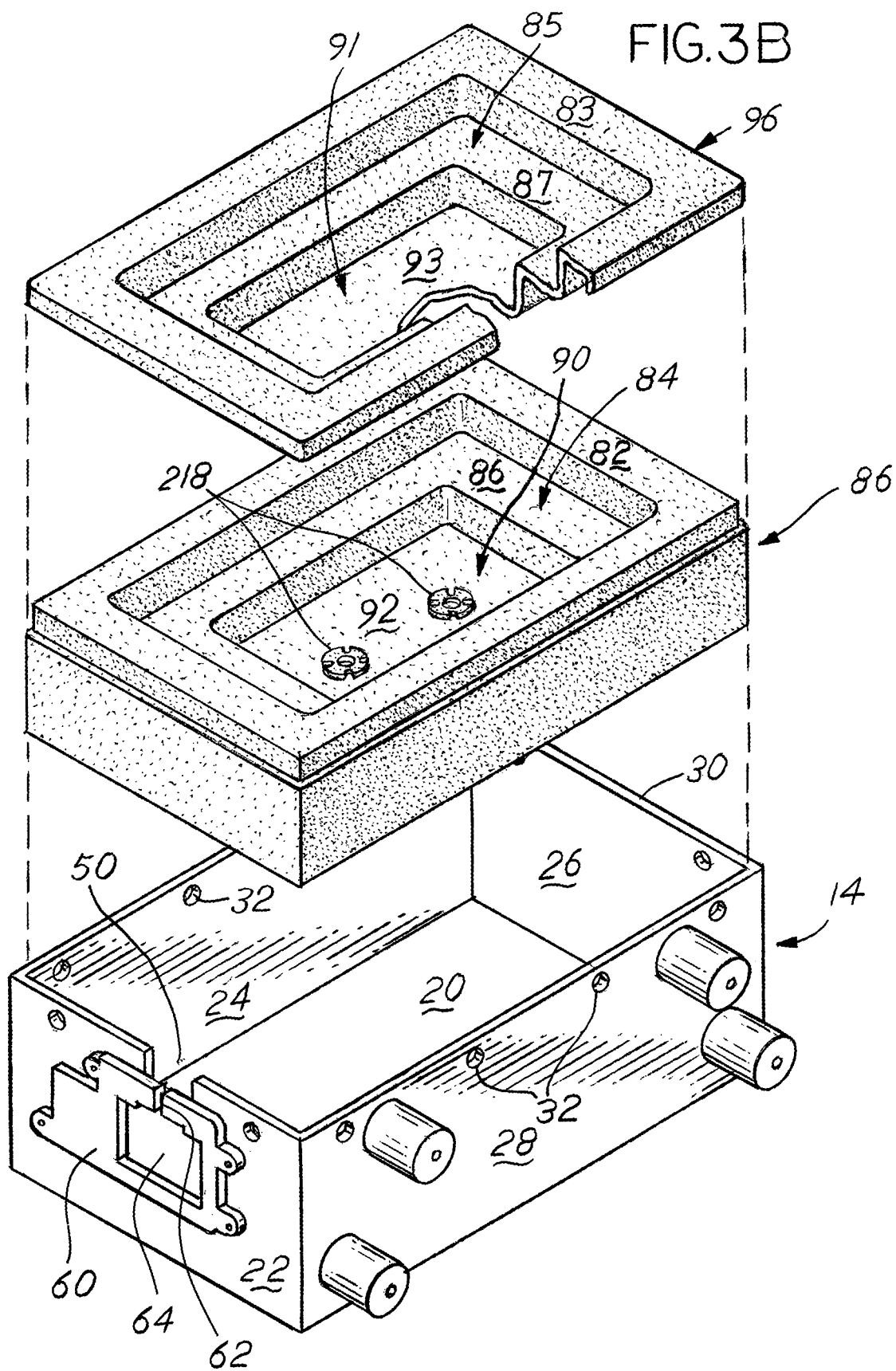

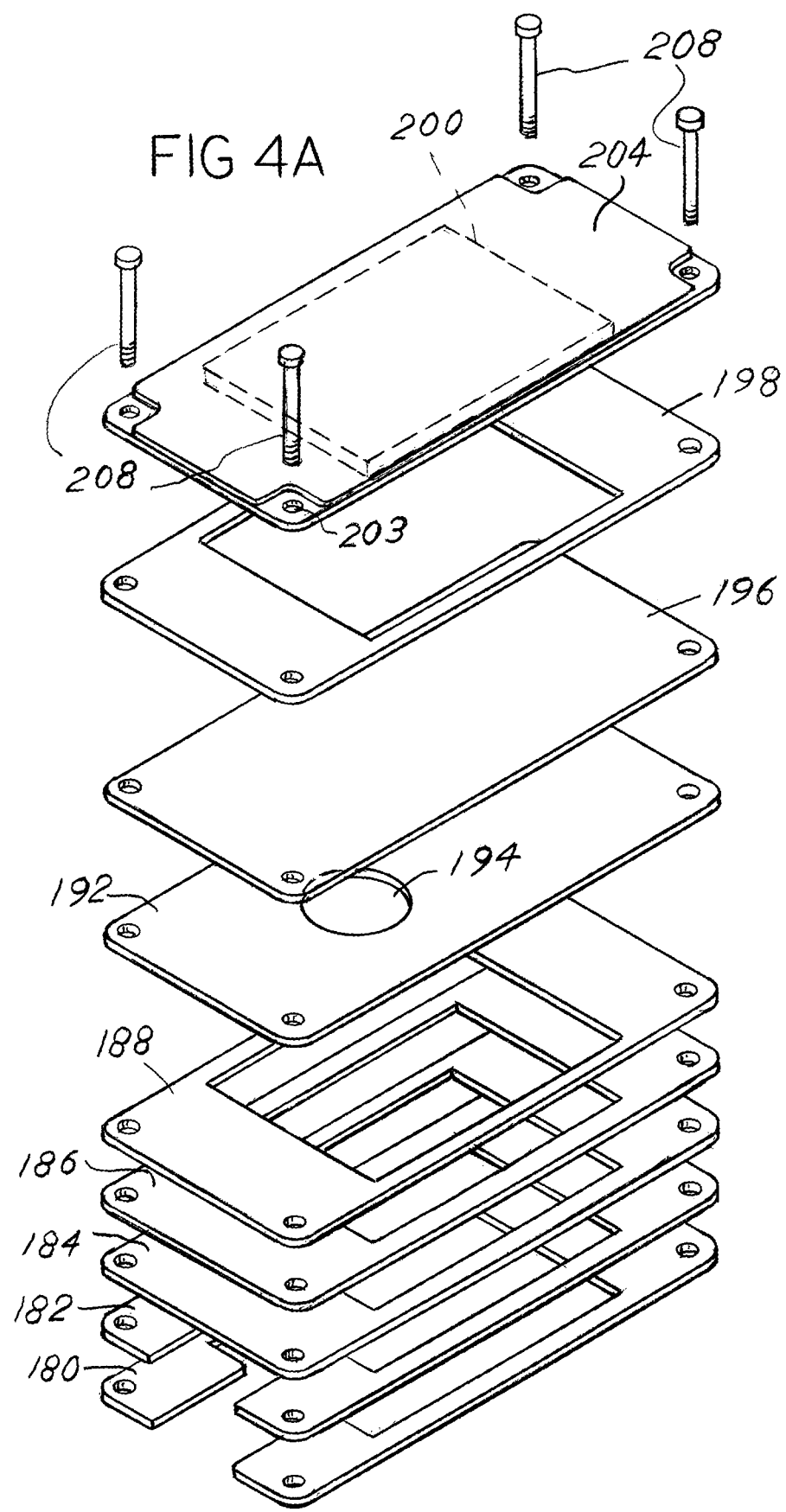

PROTECTIVE ENCLOSURE FOR DATA STORAGE

CROSS REFERENCE TO RELATED APPLICATIONS

This application is a continuation of and claims the benefit of priority from the prior U.S. patent application Ser. No. 15/909,533, filed on Mar. 1, 2018, the entire contents of which are incorporated herein by reference.

BACKGROUND OF THE INVENTION

This present disclosure relates to ruggedized data storage devices that are designed to store data and survive a catastrophic event. These include a crash, fire, flood, intense vibration, mechanical shock, or other event that would normally destroy a hard drive, flash drive, or other electronic storage device. The data storage device is a critical component for accident reconstruction, root cause analysis, or simply protecting valuable information. Many enclosures are available, such as fire safes that can store media or other valuables, but these devices require the user to open the enclosure to access the contents. Currently available enclosures that can survive the harsh conditions of a fire are too large to be portable. An improved device is needed.

SUMMARY OF THE INVENTION

The present disclosure describes a ruggedized storage device that allows electronic file access without requiring physical access to the internal components. The device has a base with joined walls to form a perimeter wall and an opening. The perimeter wall has a notch that allows a flex cable to pass through the base and communicate with an internal storage unit. The base has an insulating block made from insulation and has a pocket that can receive and hold the internal storage unit. A base cover is formed to match and overlay the base insulating block. The device includes a lid that attaches to the base and overlay the opening. The lid has an insulating block with a pocket that can receive and hold the internal storage unit. A lid cover is formed to match and overlay the base insulating block. When assembled, the internal storage unit is held between the lid and base covers and located near the midpoint between a bottom wall and the lid. The internal storage unit is formed from a series of stacked plates that form layers. The outer layers of the storage unit are thermal management layers that contain a phase transfer material that will absorb energy. The thermal management layers protect the center layer that contains a digital storage drive. The flex cable extends out from the internal storage unit and is held between the lid and base covers. The flex cable connects the digital storage drive to a sacrificial connector that is located on the perimeter wall adjacent to the notch. Fasteners hold the lid to the base, which applies biased pressure to the insulating blocks, covers, and the internal storage unit.

BRIEF DESCRIPTION OF THE DRAWINGS

A preferred embodiment of this invention has been chosen wherein:

FIG. 1 is an isometric view of the enclosure;

FIG. 2 is a section view about 2-2 of the enclosure in FIG. 1;

FIG. 3A is an exploded isometric view of the lid and storage unit;

FIG. 3B is an exploded isometric view of the base and wiring connection;

FIG. 4A is an exploded isometric view of one half of the storage unit;

DESCRIPTION OF THE PREFERRED EMBODIMENT

Figure 4B:
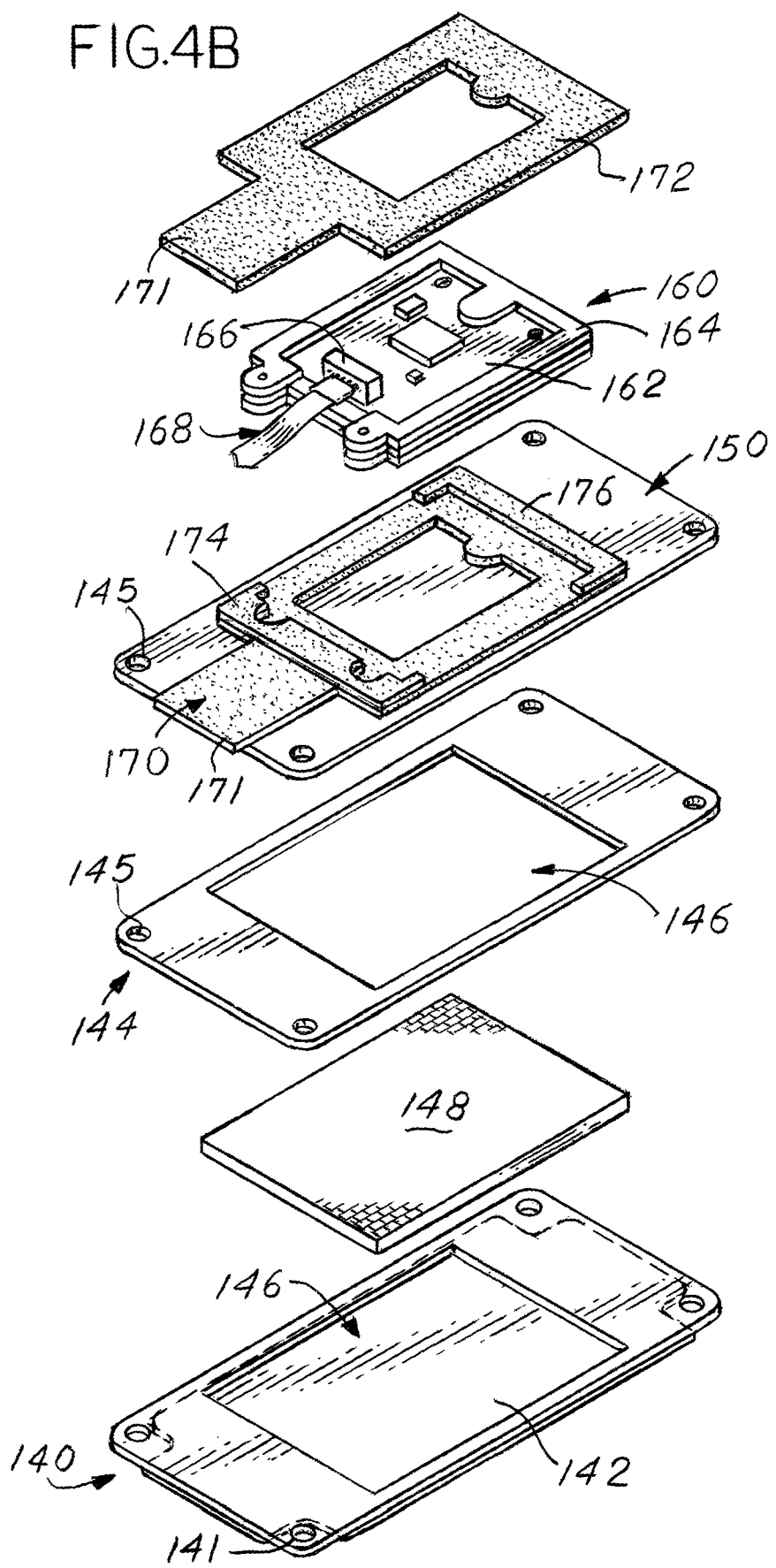
FIG. 4B is an exploded isometric view of the other half of the storage unit.

A data storage device 10 is shown in FIGS. 1-6 that has an outside shell 12. The outside shell 12 is formed from metal, such as stainless steel, and has a base 14 that is secured to a lid 16. The base 14 is made from a series of walls such as a bottom wall 20 and side walls 22, 24, 26, 28. The identification of components such as a lid 16 and walls such as a side wall 22,24,26,28 or bottom wall 20 does not define orientation and is only used as a reference. The data storage device 10 can be used or mounted in any orientation. The base, as shown, is a single sheet of material that is stamped and bent to form the walls 20,22,24,26,28. It is contemplated that the base 14 is formed from individual walls that are joined. The bottom wall 20 is affixed to the side walls 22, 24, 26, 28 through welding or other method of joining that provides a structural connection. Once joined, the side walls 22, 24, 26, 28 form a perimeter wall with a top perimeter edge 30. The top perimeter edge 30 defines the opening into the base 14. Apertures 32 located near the edge as shown in FIG. 3B.

The lid 16, as shown, is formed from a single sheet of material that is machined, but it is contemplated that the lid 16 is made from individual walls that are joined, stamped, or otherwise formed. The lid 16 has a top wall portion 40 and a skirt wall portion 42 that extends away from the top wall portion 40. The skirt wall portion 42 has threaded apertures 44 that align with apertures 32 when the lid 16 and base 14 are mated. Once aligned, the apertures 32, 44 receive fasteners 46 that affix the lid 16 to the base 14. The skirt wall portion 42 may include a key 48 to ensure the lid 16 can only be mated to the base 14 in one orientation. The lid 16 and skirt wall portion 42 form a flange that overlaps with the top perimeter edge 30. The key 48 extends down from the lid 16 by a distance 49, shown in FIG. 6.

The perimeter wall includes an egress notch 50. In the example embodiment shown herein, the egress notch 50 is on side wall 22 but it can be located on any of the walls. The egress notch 50 interrupts the top perimeter edge 30 and extends toward the bottom wall 20 by a first distance 52. The egress notch 50 has a width 54 that corresponds with the width of the key 48. The first distance 52 is greater than the skirt wall portion 42 or key 48 extends into the notch 50. As assembled, the distance 49 of the key 48 and the first distance 52 forms an egress gap. The egress gap allows an electrical connection to pass through without contacting the lid 16 or base 14. Overlaying the egress notch 50 and affixed to the base 14 is an egress plate 60, shown in FIG. 3B. It is contemplated that a high-temperature sealing component, such as a gasket, o-ring, or cured sealant that prevents liquid intrusion into the outside shell 12. The egress plate 60 may be affixed to the base 14 through welding, fasteners, or other means. The egress plate 60 includes a slit 62 that opens into an area 64. As affixed to the base 14, the slit 62 and a portion of the area 64 overlays the egress notch 50. An egress cover 66 having a notch 68 is then affixed to the egress plate 60 through fasteners. It is contemplated that the slit 62 is part of the egress notch and the egress cover 66 directly overlays and attaches to the base 14.

Located inside the base 14 is an insulating block 80 formed from high temperature insulating material. The insulating block 80 is dimensionally stable, retains its shape under compression, and can be machined. The material used in the insulating block 80 is high performance microporous insulation. The insulating block 80 has pockets that extend inwardly from a flange surface 82. The first pocket 84 extends to a first surface 86 at a first distance 88 with an outer vertical surface 72 located therebetween. The inset pocket 90 extends from the first surface 86 to a pocket surface 92 at a second distance 94 with an inner vertical surface 70 located therebetween. The surfaces and pockets form a base contour. The insulating block 80 includes a protective cover 96 that closely matches the contour of the flange surface 82 and pockets 84, 90. While not required, the protective cover 96 prevents abrasion and mechanical degradation of the insulating block 80. The close matching of the insulating block 80 contour to the protective cover 96 is necessary to minimize any interior air cavity and prevent vibration from creating unwanted relative motion between the components. The protective cover 96 has a corresponding flange wall 83, first wall 87, and pocket wall 93. An outer vertical wall 85 extends from the flange wall 83 and first wall 87 which is inset from the side walls 22, 24, 26, 28. An inner vertical wall 81 extends between the first wall 87 and pocket wall 93. As shown, it is vacuum formed thermoplastic but can be made from other materials, such as silicone, thermoset plastic, epoxy, or other materials.

The lid 16 includes a complimentary insulating block 100 formed from the same high temperature insulating material as insulating block 80. The insulating block 100 has a flange surface 102 and a protruding surface 104 spaced from the flange surface 102 by a first distance 120 with an outer vertical surface 114 located therebetween. The protruding surface 104 has an inset pocket 106 that has a pocket surface 108 that is spaced from the protruding surface 104 by a second distance 122 with an inner vertical surface 116 located therebetween. The surfaces and pocket combine to form a lid contour. The insulating block 100 has a protective cover 112 that closely matches the contour of the insulating block 100 surfaces. While not required, the protective cover 112 prevents abrasion and mechanical degradation of the insulating block 100. The protective cover 112 has a corresponding flange wall 103, protruding wall 105, and pocket wall 109. An outer vertical wall 107 extends between the flange wall 103 and protruding wall 105, which is set inward from the skirt wall portion 42. An inner vertical wall 101 extends between the protruding wall 105 and pocket wall 109, which is inset from the outer vertical wall 107 and skirt wall portion 42. When the lid 16 is mated to the base 14, the protective covers 96, 112 are in biased contact with each other as shown in FIG. 2. As assembled, the inset pockets 90 and 106 form a cavity that is closely sized to receive a storage unit 130.

The storage unit 130 is shown in exploded diagram FIGS. 4a and 4b. As shown, the storage unit 130 is an assembly of plates that are held together with fasteners. The identification of component location, such as top or bottom, does not define physical orientation and is only used as an identifying reference point. The storage unit has a bottom plate 140 that has threaded holes 141 and a thin metal sheet 142 that is affixed to it, commonly through tack welding, but other methods of affixing are contemplated. A second plate 144 has holes 145 similar to holes 141 but these are not threaded. Plates 140, 144 each have an opening 146 that is sized to receive a phase-transfer heat absorber 148. The heat absorber 148 is commonly made from an alloy of metals and is designed to absorb heat as it changes phase from a solid to a liquid. The heat absorber 148 in this embodiment is a tin/copper alloy with over 99% tin and less than 1% copper (the preferred percentage is 99.3% tin and 0.7% copper). This ratio of metals provides a phase change temperature that is around 423 degrees Fahrenheit (217 degrees Celsius). Heat energy is absorbed/consumed at a high rate due to the latent heat required for the phase change. It is contemplated that other alloys, metals, or materials are used for the heat absorber 148. A smooth plate 150 has holes 145 but is otherwise uninterrupted. As assembled, smooth plate 150 and thin metal sheet 142 form boundaries to contain the heat absorber 148. The heat absorber 148 is very close in thickness to the combined thickness of plates 140 and 144 so it resides securely without movement. It is contemplated that a different quantity of plates 144 would be included and the heat absorber 148 would match the thickness of a single or multiple plates 144 to allow different heat absorbing properties.

A digital drive module 160 has a circuit board 162 and a frame 164 that secures the circuit board 162. A connector 166 connects to a sacrificial flex cable 168 that is thin and has limited heat transfer properties. As shown, the flex cable 168 is a polyimide film with metal circuits applied thereto, but other cable types are contemplated. In this embodiment, the benefit of the flex cable 168 is its attenuated heat transfer properties and thickness. The attenuated heat transfer properties are a result of having a very small amount of metal in the circuit and the remainder of the flex cable 168 is polymer. It can easily be placed between the protective covers 96, 112 without the need to provide a channel. The digital drive module 160 in this embodiment uses USB for communication and/or file access, but other communication protocols, methods, or wiring are contemplated. The frame 164 is made up of a stack of plates that are fastened together. In the event that the flex cable 168 is damaged, it can be disconnected from the connector 166 and replaced to access the contents stored on the circuit board 162. At the outer end of the flex cable 168 is a sacrificial connector 220 that is sized to fit into the area 64 and be covered by the egress cover 66. An interface wire 222 extends through the notch 68.

Located adjacent the digital drive module 160 is an upper pad 170 and a lower pad 172. The pads 170, 172 are a high temperature resilient material that cushions and supports the digital drive module 160. Additional pads 174, 176 support the digital drive module 160 and assist to position the module. The pads 170, 172 have a tongue portion 171 that extends beyond the outside envelope of the storage unit 130. This provides a strain relief for the flex cable 168 and prevents it from contacting any edges or corners on the storage unit 130. The next plates in the storage unit 130 are two notched plates 180, 182. The notched plates 180, 182 allow the tongue portions 171 of the pads 170, 172 to extend from inside the storage unit 130 to the outside. Additional plates 184, 186, 188, similar to plate 144, overlay notched plate 182. The additional plates have a central opening 190, similar to opening 146. The central opening 190 and opening in notched plates 180, 182 provide an interior cavity for the digital drive module 160. Overlaying plate 188 is a plate 192 that has an aperture 194. Aperture 194 provides clearance for the connector 166 on the digital drive module 160 as assembled. This is visible in section view FIG. 5. Overlaying plate 192 is another smooth plate 196, similar to smooth plate 150. Overlaying the smooth plate 196 is a second plate 198, second heat absorber 200, top plate 202 with a thin metal sheet 204 affixed thereto. The holes 203 in the top plate 202 may be enlarged to fit the heads of fasteners 208. The fasteners 208 extend through all of the plates and thread into threaded holes 141 in the bottom plate 140. The outermost plates (140 and 202) may have a smaller perimeter. As assembled, the outer layers of the storage unit 130 are symmetrical. Sheets 142, 204 are both outward facing and attached to plates 140, 202. Plates 144 and 198 are the next layer inward, with both sets each carrying a corresponding heat absorber 148, 200. The next layers inward are smooth plates 150 and 196 respectively. The combination of sheet 142, plates 140, 144, 150, and heat absorber 148 form a first outer thermal management layer 149. Symmetrically, the combination of sheet 204, plates 202, 198, 196, and heat absorber 200 forms a second outer thermal management layer 201. The first and second outer thermal management layers create a sandwich, where the center 205 is formed from plates 180, 182, 184, 186, 188, and 192. The notched plates 180, 182 may be relocated in the center, depending on the desired routing of the flex cable 168. For example, plates 184, 186, 188 may be located between plate 150 and 180. The center holds the pads 170, 172, 174, 176 and the digital drive module 160.

Figure 5:
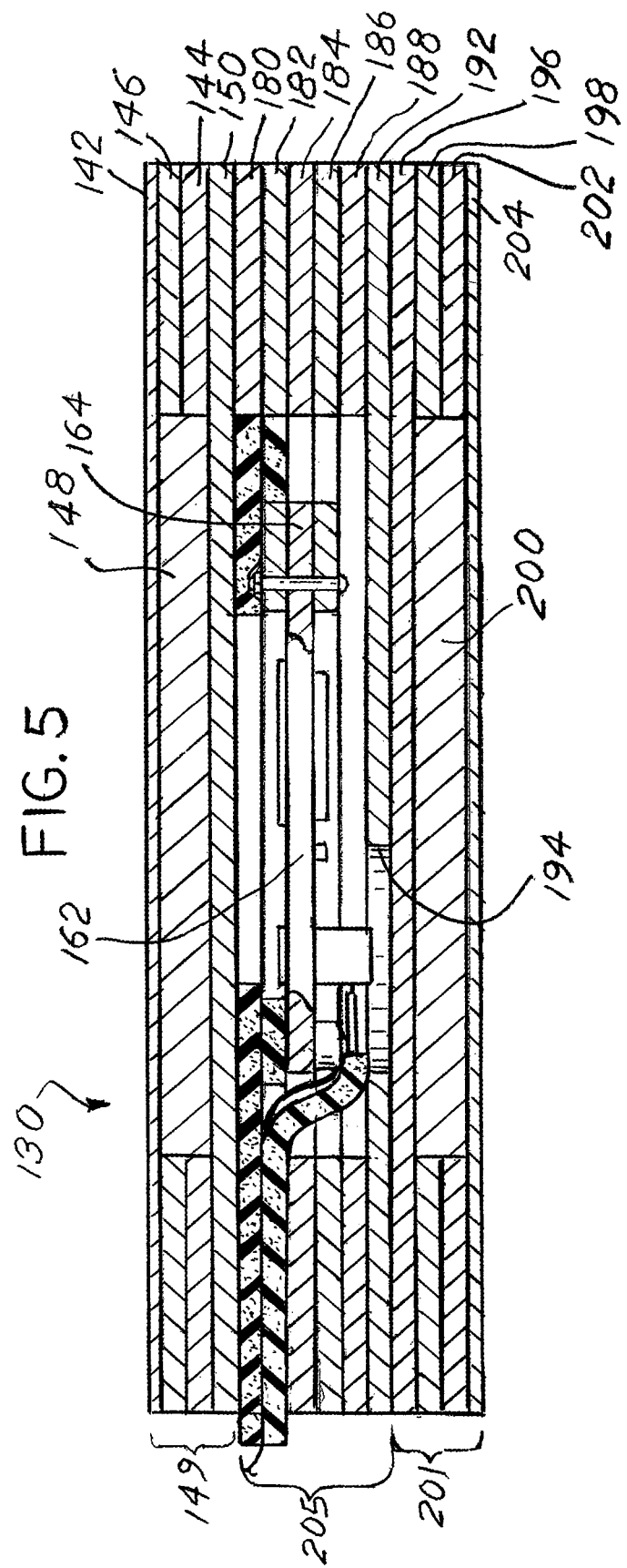
FIG. 5 is a side section view 5-5 of the storage unit in FIG. 3A.
Figure 6:
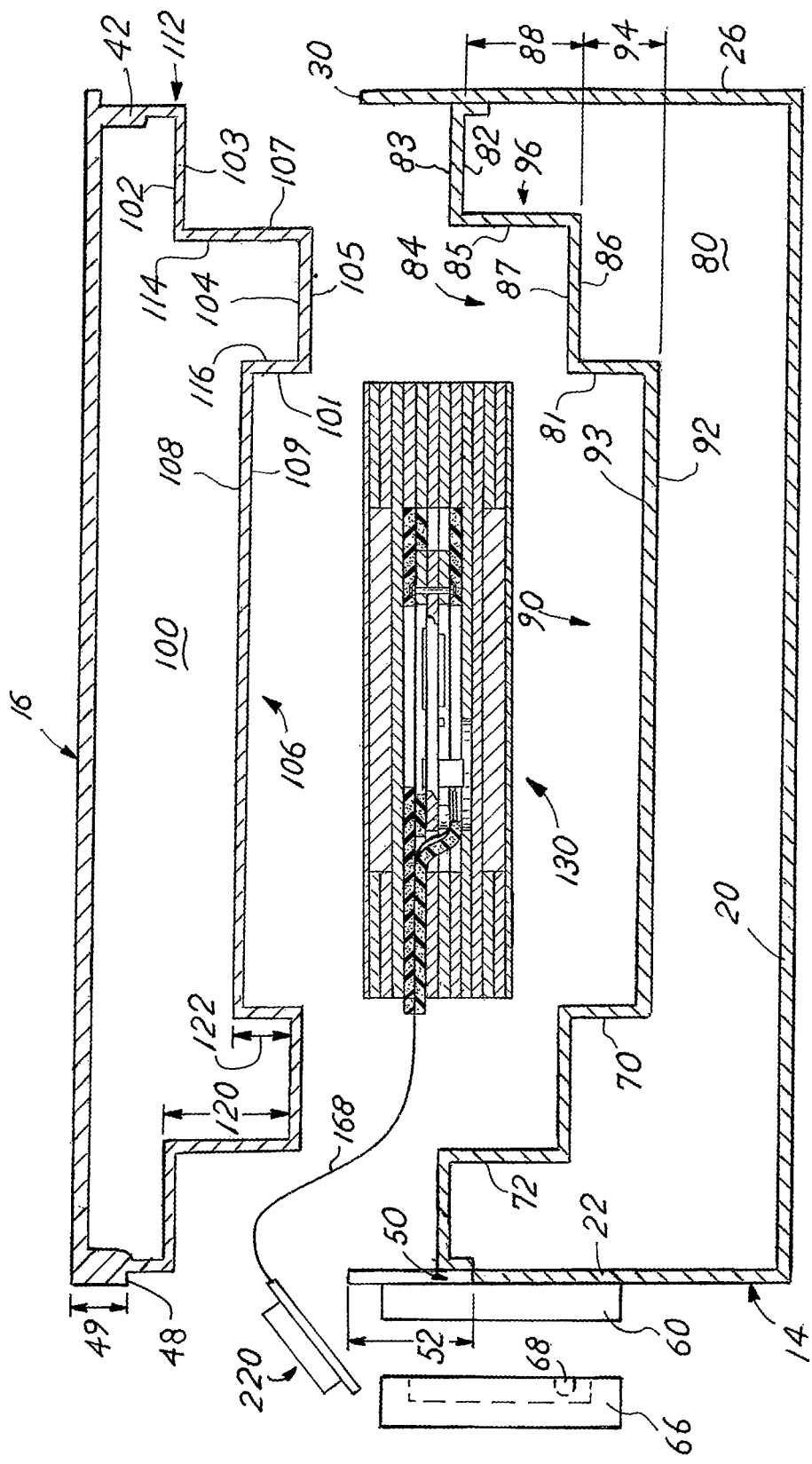
FIG. 6 is a partially assembled view of the enclosure in FIG. 2.

To assemble the storage device 10, the user assembles the storage unit 130 by aligning the digital drive module 160, plates, and heat absorbers 148, 200 as shown in FIGS. 4a-4b and 5. Fasteners 208 are then inserted and tightened to compress the storage unit 130. The insulating block 80 and cover 96 are inserted into the base 14. The insulating block 100 and cover 112 are assembled to the lid 16. The flex cable 168 is passed through the slit 62 in the plate 60 and the sacrificial connector 220 is placed in the area 64. The egress cover 66 is then installed with the interface wire passing through the notch 68. The storage unit 130 is then placed into the second pocket 90 over dampers 218. The dampers 218 have radial slots and a center hole. The dampers 218 are resilient, provide shock absorption, and can take up any excess space between the storage unit 130 and the adjacent cover 96, 112. This prevents the storage unit 130 from moving with respect to the enclosure as assembled. The lid 16 is assembled to the base 14 and the fasteners 46 are tightened.

As assembled, the device 10 is designed to provide a barrier to heat, vibration, liquids, and other conditions that would damage a common data storage device. To protect from extreme heat, the insulating blocks 80, 100 are made from high performance microporous insulating material. The insulating blocks 80, 100 are strong in compression and resist crushing. The storage unit 130 is placed in the center of the outside shell 12 to best protect from any heat that is radiated through the insulating blocks 80, 100. To further describe the location, the storage unit 130 is centered between walls 22 and 26, walls 24 and 28, and bottom 20 and the lid 16. The flex cable 168, due to its thickness and routing, has very limited heat transfer properties. Should the storage device 10 be exposed to high temperatures for enough time for the heat to penetrate the insulating blocks 80, 100, the heat absorbers 148, 200 begin to absorb energy. They rise in temperature until the phase begins to change from a solid to a liquid. During the phase transition (also called the latent heat of fusion), the temperature remains constant as the heat absorbers 148, 200 continue to absorb energy. This protects the digital drive module 160 from temperatures that would damage the electronic components.

To protect from other intrusion, the lid 16 has a skirt wall portion 42 that fits between walls 22, 24, 26, 28 with a close tolerance and is secured with fasteners. Further, to reduce intrusion, the covers 96, 112 are in biased contact when assembled. Further, the interior volume of air is minimized. Anything that may make it past the lid 16 and covers 96, 112 is not likely to follow the flex cable 168 into the storage unit 130 due to the biased contact between the tongue portions 171 of the pads 170, 172. The resilience of the pads 170, 172 contours to the thickness and shape of the flex cable 168. The welds or other joining methods between the bottom wall 20 and side walls 22, 24, 26, 28 are liquid-tight. Further, the combination of the walls 87, 105, vertical walls 85, 107, and flange walls 83, 103 create a tortious path for the flex cable 168 that easily conforms due to its flexible nature. The tortious path also prevents any direct access from heat that may enter through the egress gap of the base 14.

The egress notch 50 is aligned with the flange wall 83 and flange wall 103 to allow the flex cable 168 a straight passage through the egress gap of the base 14.

To protect from mechanical shock and vibration, the internal components are held together with the lid 16 and are sized to be in biased contact as assembled. The digital drive module 160 is held in all directions by pads 170, 172, 174, 176 and the storage unit 130 is held with dampers 218. The flex cable 168 is a common component used where flexibility is needed and when vibration is present.

In the event of a fire where the interface wire 222, sacrificial connector 220, and flex cable 168 are destroyed or damaged, the data recovery is done by removing the fasteners, lid 16, and egress cover 66. In this case, the protective covers 96, 112 may be melted together, forming a seal around the storage unit 130. The protective covers 96, 112 are separated and the storage unit 130 removed. The fasteners 208 are removed to access the connector 166, where a new flex cable 168, sacrificial connector 220, and interface wire 222. If just the interface wire 222 is damaged or destroyed, the egress cover 66 can be removed, interface wire 222 disconnected from the sacrificial connector 222, and replaced without having to remove or disturb the lid 16. It is contemplated that the egress cover 66 allows a direct connection to the sacrificial connector, such as a USB connection, directly without the need for an interface wire 222.

The outside shell 12 includes a handle 230 and mounting features 232, 234. The mounting features 232, as shown, are affixed to side wall 28, but it is contemplated they are affixed to other walls in the outside shell 12.

It is understood that while certain aspects of the disclosed subject matter have been shown and described, the disclosed subject matter is not limited thereto and encompasses various other embodiments and aspects. No specific limitation with respect to the specific embodiments disclosed herein is intended or should be inferred. Modifications may be made to the disclosed subject matter as set forth in the following claims.

What is claimed is:

1. A protective data storage enclosure comprising:
    a metal base having a bottom wall joined to upstanding walls, said upstanding walls affixed to adjacent upstanding walls to form a perimeter wall, said perimeter wall having a perimeter edge located oppositely said bottom wall to define an opening into said base;
    a base insulating block formed from high temperature insulation, said base insulating block located in said metal base and having a base inset pocket with a base pocket surface, said base insulating block including a flange surface offset from said base pocket surface;

a metal lid affixed to said metal base at said perimeter edge;

a lid insulating block formed from high temperature insulation and having a lid inset pocket with an upper pocket surface surrounded by a flange surface offset therefrom;

a storage unit having a first outer thermal management layer and a second outer thermal management layer, a center layer located between said first and second outer thermal management layers, said center layer having a digital drive module located therein, said storage unit having a flex cable connected to said digital drive module on a first end and extending outwardly from said storage unit, said flex cable extending through said perimeter wall;

when said lid is mated with said base, said insulating blocks of said lid and said base in biased contact, said storage unit and a portion of said flex cable held between said insulating blocks of said lid and said base; and an egress cover overlaying a sacrificial connector connected to a second end of said flex cable to constrain said sacrificial connector between said perimeter wall and said egress cover.

2. The protective data storage enclosure of claim 1, said base insulating block having a base protective cover overlaying and matching a contour of said base insulating block, said base protective cover having a flange wall, said lid insulating block having a lid protective cover, said lid protective cover overlaying and matching a contour of said lid insulating block.

3. The protective data storage enclosure of claim 2, said surfaces of said blocks and said walls of said protective covers cooperating to form a tortious path, said flex cable being located in said tortious path.

4. The protective data storage enclosure of claim 1, said perimeter wall having an egress notch, said egress cover overlaying said egress notch.

5. The protective data storage enclosure of claim 4, said lid partially extending into said egress notch to create an egress gap, said flex cable extending through said egress gap.

6. The protective data storage enclosure of claim 1, said lid having a skirt wall partially extending into said opening.

7. The protective data storage enclosure of claim 1, wherein said storage unit is held in biased contact between said insulating blocks and located at a midpoint between said bottom wall and said lid.

8. The protective data storage enclosure of claim 1, wherein said thermal management layers each contain a phase change heat absorber.

9. A protective data storage enclosure comprising:

a metal base having a bottom wall joined to upstanding walls, said upstanding walls affixed to adjacent upstanding walls to form a perimeter wall, said perimeter wall having a perimeter edge located oppositely said bottom wall to define an opening into said base;

a base insulating block formed from high temperature insulation, said base insulating block located in said metal base and having a base inset pocket with a base pocket surface;

a metal lid affixed to said metal base at said perimeter edge;

a lid insulating block formed from high temperature insulation and having a lid inset pocket with an upper pocket surface;

a storage unit having a first outer thermal management layer and a second outer thermal management layer, a center layer located between said first and second outer thermal management layers, said center layer having a digital drive module located therein, said storage unit having a flex cable connected to said digital drive module on a first end and extending outwardly from said storage unit, said flex cable extending through said perimeter wall;

when said lid is mated with said base, said insulating blocks of said lid and said base in biased contact, and a portion of said flex cable held between said insulating blocks of said lid and said base and extending through said perimeter wall; and a sacrificial connector electrically connected to a second end of said flex cable.

10. The protective data storage enclosure of claim 9, said base insulating block having a base protective cover overlaying and matching a contour of said base insulating block, said lid insulating block having a lid protective cover, said lid protective cover overlaying and matching a contour of said lid insulating block, said storage unit held between said base pocket surface and said upper pocket surface.

11. The protective data storage enclosure of claim 10, said insulating blocks and said protective covers cooperating to form a tortious path, said flex cable being located in said tortious path.

12. The protective data storage enclosure of claim 9, said perimeter wall having an egress notch, an egress cover overlaying said egress notch, said flex cable extending through said egress notch.

13. The protective data storage enclosure of claim 9, said lid having a skirt wall partially extending into said opening.

14. The protective data storage enclosure of claim 9, wherein said storage unit is located at a midpoint between said bottom wall and said lid.

15. The protective data storage enclosure of claim 9, an egress cover constraining said sacrificial connector, said egress cover affixed to said perimeter wall.

16. A protective data storage enclosure comprising:

a metal base having a bottom wall joined to upstanding walls, said upstanding walls affixed to adjacent upstanding walls to form a perimeter wall, said perimeter wall having a perimeter edge located oppositely said bottom wall to define an opening into said base;

a base insulating block formed from high temperature insulation, said base insulating block located in said metal base;

a metal lid affixed to said metal base at said perimeter edge;

a lid insulating block formed from high temperature insulation and having a lid inset pocket with an upper pocket surface surrounded by a flange surface offset therefrom, a storage unit having a first outer thermal management layer and a second outer thermal management layer, a center layer located between said first and second outer thermal management layers, said center layer having a digital drive module located therein, said storage unit having a flex cable connected to said digital drive module on a first end and extending outwardly from said storage unit, said flex cable extending through said perimeter wall;

when said lid is mated with said base, said insulating blocks of said lid and said base in biased contact, and a portion of said flex cable held between said insulating blocks of said lid and said base and extending through said perimeter wall; and a sacrificial connector electrically connected to a second end of said flex cable.

17. The protective data storage enclosure of claim 16, said base insulating block having a base protective cover overlaying and matching a contour of said base insulating block, said base protective cover having a flange wall, said lid insulating block having a lid protective cover with a flange wall, said lid protective cover overlaying and matching a contour of said lid insulating block, said storage unit held between said protective covers.

18. The protective data storage enclosure of claim 17, said blocks and said protective covers cooperating to form a tortious path, said flex cable being located in said tortious path.

19. The protective data storage enclosure of claim 16, said perimeter wall having an egress notch, an egress cover overlaying said egress notch, said flex cable extending through said egress notch.

20. The protective data storage enclosure of claim 16, further comprising an egress cover constraining said sacrificial connector, said egress cover affixed to said perimeter wall.

* * * * *